US008050307B2

(12) United States Patent
Day et al.

(10) Patent No.: US 8,050,307 B2
(45) Date of Patent: Nov. 1, 2011

(54) COMPACT MID-IR LASER

(75) Inventors: Timothy Day, Poway, CA (US); David F. Arnone, Mountain View, CA (US)

(73) Assignee: Daylight Solutions, Inc., San Diego, CA (US)

(*) Notice: Subject to any disclaimer, the term of this patent is extended or adjusted under 35 U.S.C. 154(b) by 0 days.

(21) Appl. No.: 12/987,830

(22) Filed: Jan. 10, 2011

(65) Prior Publication Data
US 2011/0103414 A1 May 5, 2011

Related U.S. Application Data

(63) Continuation of application No. 12/697,155, filed on Jan. 29, 2010, and a continuation of application No. 12/354,237, filed on Jan. 15, 2009, now Pat. No. 7,873,094, said application No. 12/697,155 is a continuation of application No. 11/154,264, filed on Jun. 15, 2005, now Pat. No. 7,492,806, said application No. 12/354,237 is a continuation of application No. 11/154,264.

(51) Int. Cl.
*H01S 3/08* (2006.01)
*H01S 3/04* (2006.01)
*H01S 3/30* (2006.01)
(52) U.S. Cl. .................. 372/101; 372/34; 372/36; 372/4
(58) Field of Classification Search .................. None
See application file for complete search history.

(56) References Cited

U.S. PATENT DOCUMENTS

| 2,684,015 A | * | 7/1954 | Grey | 359/351 |
|---|---|---|---|---|
| 3,782,832 A | | 1/1974 | Hacskaylo | |
| 4,266,873 A | | 5/1981 | Hacskaylo et al. | |
| 4,470,662 A | | 9/1984 | Mumzhiu | |
| 4,555,627 A | | 11/1985 | McRae, Jr. | |
| 4,656,641 A | | 4/1987 | Scifres et al. | |
| 4,737,028 A | | 4/1988 | Smith | |

(Continued)

FOREIGN PATENT DOCUMENTS

DE 10205310 A1 9/2003

(Continued)

OTHER PUBLICATIONS

Weida et al., Utilizing broad gain bandwith in quantum cascade devices, Nov. 2010, vol. 49(11) Optical Engineering, 111120, 0091-3286/2010 © 2010 SPIE.

(Continued)

*Primary Examiner* — Jessica Stultz
*Assistant Examiner* — Sean Hagan
(74) *Attorney, Agent, or Firm* — Roeder & Broder LLP (57) ABSTRACT

A compact mid-IR laser device utilizes a quantum cascade laser to provide mid-IR frequencies suitable for use in molecular detection by signature absorption spectra. The compact nature of the device is obtained owing to an efficient heat transfer structure, the use of a small diameter aspheric lens and a monolithic assembly structure to hold the optical elements in a fixed position relative to one another. Efficient heat transfer is achieved using a thermoelectric cooler TEC combined with a high thermal conductivity heat spreader onto which the quantum cascade laser is thermally coupled. The heat spreader not only serves to dissipate heat and conduct same to the TEC, but also serves as an optical platform to secure the optical elements within the housing in a fixed relationship relative on one another.

16 Claims, 7 Drawing Sheets

U.S. PATENT DOCUMENTS

| | | | |
|---|---|---|---|
| 4,745,276 A | 5/1988 | Broicher et al. | |
| 4,772,789 A | 9/1988 | Maram et al. | |
| 4,796,266 A | 1/1989 | Banwell et al. | |
| 4,852,956 A | 8/1989 | Kramer | |
| 4,871,916 A | 10/1989 | Scott | |
| 5,005,934 A | 4/1991 | Curtiss | |
| 5,050,176 A | 9/1991 | Naito et al. | |
| 5,056,097 A | 10/1991 | Meyers | |
| 5,064,988 A | 11/1991 | E'nama et al. | |
| 5,068,867 A | 11/1991 | Hasenberg et al. | |
| 5,082,339 A | 1/1992 | Linnebach | |
| 5,082,799 A | 1/1992 | Holmstrom et al. | |
| 5,118,186 A | 6/1992 | Schraetzenstaller et al. | |
| 5,140,599 A | 8/1992 | Trutna, Jr. et al. | |
| 5,161,408 A | 11/1992 | McRae et al. | |
| 5,172,390 A * | 12/1992 | Mooradian | 372/92 |
| 5,181,214 A * | 1/1993 | Berger et al. | 372/34 |
| 5,208,417 A | 5/1993 | Langer et al. | |
| 5,225,679 A | 7/1993 | Clarke et al. | |
| 5,255,073 A | 10/1993 | Wallin et al. | |
| 5,264,368 A | 11/1993 | Clarke et al. | |
| 5,315,436 A | 5/1994 | Lowehnar et al. | |
| 5,331,651 A | 7/1994 | Becker et al. | |
| 5,355,609 A | 10/1994 | Schenke | |
| 5,430,293 A | 7/1995 | Sato et al. | |
| 5,457,709 A | 10/1995 | Capasso et al. | |
| 5,476,385 A | 12/1995 | Parikh et al. | |
| 5,491,714 A | 2/1996 | Kitamura | |
| 5,523,569 A | 6/1996 | Hornfeld et al. | |
| 5,537,432 A | 7/1996 | Mehuys et al. | |
| 5,656,813 A | 8/1997 | Moore et al. | |
| 5,662,819 A | 9/1997 | Kadomura | |
| 5,671,561 A | 9/1997 | Johnson et al. | |
| 5,685,636 A | 11/1997 | German | |
| 5,751,830 A | 5/1998 | Hutchinson | |
| 5,752,100 A | 5/1998 | Schrock | |
| 5,780,724 A | 7/1998 | Olender et al. | |
| 5,824,884 A | 10/1998 | Olender et al. | |
| 5,834,632 A | 11/1998 | Olender et al. | |
| 5,854,422 A | 12/1998 | McKeon et al. | |
| 5,862,162 A | 1/1999 | Maeda | |
| 5,866,073 A | 2/1999 | Sausa et al. | |
| 5,892,617 A | 4/1999 | Wallace | |
| 6,089,076 A | 7/2000 | Mueller et al. | |
| 6,134,257 A | 10/2000 | Capasso et al. | |
| 6,154,307 A | 11/2000 | Veronesi et al. | |
| 6,157,033 A | 12/2000 | Chudnovsky | |
| 6,192,064 B1 | 2/2001 | Algots et al. | |
| 6,243,404 B1 | 6/2001 | Joyce | |
| 6,326,646 B1 * | 12/2001 | Baillargeon et al. | 372/43.01 |
| 6,327,896 B1 | 12/2001 | Veronesi et al. | |
| 6,363,648 B1 | 4/2002 | Kranich et al. | |
| 6,400,744 B1 | 6/2002 | Capasso et al. | |
| 6,431,732 B1 | 8/2002 | Brown et al. | |
| 6,470,036 B1 | 10/2002 | Bailey et al. | |
| 6,483,978 B1 | 11/2002 | Gao et al. | |
| 6,553,045 B2 | 4/2003 | Kaspi | |
| 6,575,641 B2 | 6/2003 | Yamabayashi et al. | |
| 6,578,311 B2 | 6/2003 | Danielson et al. | |
| 6,608,847 B2 | 8/2003 | Zhang et al. | |
| 6,616,452 B2 | 9/2003 | Clark et al. | |
| 6,636,539 B2 | 10/2003 | Martinsen | |
| 6,690,472 B2 | 2/2004 | Kulp et al. | |
| 6,714,564 B1 | 3/2004 | Meyers | |
| 6,782,162 B2 | 8/2004 | Fukuzawa et al. | |
| 6,803,577 B2 | 10/2004 | Edner et al. | |
| 6,856,717 B2 | 2/2005 | Kilian | |
| 6,859,481 B2 | 2/2005 | Zheng | |
| 6,866,089 B2 | 3/2005 | Avila | |
| 6,885,965 B2 | 4/2005 | Butler et al. | |
| 6,909,539 B2 | 6/2005 | Korniski et al. | |
| 6,995,846 B2 | 2/2006 | Kalayeh et al. | |
| 7,032,431 B2 | 4/2006 | Baum et al. | |
| 7,051,469 B1 | 5/2006 | Pochapsky et al. | |
| 7,061,022 B1 | 6/2006 | Pham et al. | |
| 7,088,076 B2 | 8/2006 | Densham et al. | |
| 7,151,787 B2 | 12/2006 | Kulp et al. | |
| 7,189,970 B2 | 3/2007 | Racca et al. | |
| 7,231,862 B1 | 6/2007 | Quinn | |
| 7,265,842 B2 | 9/2007 | Paldus et al. | |
| 7,325,318 B2 | 2/2008 | Roes | |
| 7,325,354 B2 | 2/2008 | Grauslys et al. | |
| 7,345,277 B2 | 3/2008 | Zhang | |
| 7,358,498 B2 | 4/2008 | Geng et al. | |
| 7,424,042 B2 | 9/2008 | Day et al. | |
| 7,429,734 B1 | 9/2008 | Tidwell | |
| 7,466,734 B1 | 12/2008 | Day et al. | |
| 7,490,430 B2 | 2/2009 | Staley | |
| 7,492,806 B2 | 2/2009 | Day et al. | |
| 7,505,119 B2 | 3/2009 | Rogers | |
| 7,535,656 B2 | 5/2009 | Day et al. | |
| 7,535,936 B2 | 5/2009 | Day et al. | |
| 7,559,169 B2 | 7/2009 | Hung et al. | |
| 7,590,316 B2 | 9/2009 | Dames | |
| 7,623,234 B2 | 11/2009 | Puzey | |
| 7,732,767 B2 | 6/2010 | Houde-Walter | |
| 7,733,925 B2 | 6/2010 | Pushkarsky et al. | |
| 7,753,549 B2 | 7/2010 | Solinsky et al. | |
| 7,755,041 B2 | 7/2010 | Killinger et al. | |
| 7,796,341 B2 | 9/2010 | Day et al. | |
| 7,818,911 B2 | 10/2010 | Houde-Walter | |
| 7,826,503 B2 | 11/2010 | Day et al. | |
| 7,848,382 B2 | 12/2010 | Weida et al. | |
| 7,873,094 B2 | 1/2011 | Day et al. | |
| 7,920,608 B2 | 4/2011 | Marsland, Jr. et al. | |
| 2002/0024979 A1 | 2/2002 | Vilhelmsson et al. | |
| 2002/0064198 A1 | 5/2002 | Koizumi | |
| 2002/0090013 A1 | 7/2002 | Murry et al. | |
| 2002/0105699 A1 | 8/2002 | Miracky et al. | |
| 2002/0150133 A1 | 10/2002 | Aikiyo et al. | |
| 2002/0176473 A1 | 11/2002 | Mouradian | |
| 2003/0043877 A1 | 3/2003 | Kaspi | |
| 2003/0063633 A1 | 4/2003 | Zhang et al. | |
| 2003/0095346 A1 * | 5/2003 | Nasu et al. | 359/820 |
| 2003/0123495 A1 | 7/2003 | Cox | |
| 2003/0127596 A1 | 7/2003 | Kosterev et al. | |
| 2003/0174315 A1 | 9/2003 | Byren et al. | |
| 2003/0179789 A1 | 9/2003 | Pilgrim et al. | |
| 2003/0198274 A1 * | 10/2003 | Lucchetti | 372/109 |
| 2004/0013154 A1 | 1/2004 | Zheng | |
| 2004/0032891 A1 | 2/2004 | Ikeda et al. | |
| 2004/0095579 A1 | 5/2004 | Bisson et al. | |
| 2004/0165640 A1 | 8/2004 | Clifford et al. | |
| 2004/0208602 A1 | 10/2004 | Plante | |
| 2004/0228371 A1 | 11/2004 | Kolodzey et al. | |
| 2004/0238811 A1 | 12/2004 | Nakamura et al. | |
| 2004/0264523 A1 | 12/2004 | Posamentier | |
| 2005/0083568 A1 | 4/2005 | Nakae et al. | |
| 2005/0105566 A1 | 5/2005 | Sacher | |
| 2005/0199869 A1 * | 9/2005 | Shi | 257/1 |
| 2005/0213627 A1 | 9/2005 | Masselink et al. | |
| 2005/0237524 A1 | 10/2005 | Kamei | |
| 2006/0056466 A1 | 3/2006 | Belenky et al. | |
| 2006/0214107 A1 | 9/2006 | Mueller | |
| 2006/0262316 A1 | 11/2006 | Baney | |
| 2006/0268947 A1 | 11/2006 | Kalayeh | |
| 2007/0019702 A1 | 1/2007 | Day et al. | |
| 2007/0030865 A1 | 2/2007 | Day et al. | |
| 2007/0047599 A1 | 3/2007 | Wysocki et al. | |
| 2007/0209268 A1 | 9/2007 | Birurakis et al. | |
| 2007/0291804 A1 | 12/2007 | Day et al. | |
| 2008/0075133 A1 | 3/2008 | Day et al. | |
| 2008/0231719 A1 | 9/2008 | Benson | |
| 2008/0298406 A1 | 12/2008 | Day et al. | |
| 2008/0304524 A1 | 12/2008 | Marsland et al. | |
| 2009/0015914 A1 | 1/2009 | Duncan et al. | |
| 2009/0159798 A1 | 6/2009 | Weida et al. | |
| 2009/0213882 A1 | 8/2009 | Weida et al. | |
| 2009/0257709 A1 | 10/2009 | Dames | |
| 2009/0262768 A1 | 10/2009 | Day et al. | |
| 2010/0110198 A1 | 5/2010 | Larson et al. | |
| 2010/0132581 A1 | 6/2010 | Day et al. | |
| 2010/0229448 A1 | 9/2010 | Houde-Walter et al. | |
| 2010/0243891 A1 | 9/2010 | Day et al. | |
| 2011/0006229 A1 | 1/2011 | Day et al. | |

FOREIGN PATENT DOCUMENTS

| | | | |
|---|---|---|---|
| EP | 0877 454 A1 | 11/1998 | |
| EP | 0 883 220 A2 | 12/1998 | |
| EP | 2 081 265 A3 | 9/2009 | |
| GB | 2286901 A | 8/1995 | |
| JP | 55087107 A | 7/1980 | |
| JP | 58072108 | 4/1983 | |
| JP | 03-048480 A | 3/1991 | |
| JP | 07-024322 B | 1/1995 | |
| JP | 2005317819 A | 11/2005 | |
| WO | WO9220127 A1 | 11/1992 | |
| WO | WO 03/067720 A2 | 8/2003 | |
| WO | WO2008036881 A2 | 3/2008 | |
| WO | WO2008036884 A2 | 3/2008 | |

OTHER PUBLICATIONS

European Search Report for European Application No. 06844137.7, publication date Mar. 31, 2010, Daylight Solutions, Inc. (provided in parent U.S. Appl. No. 11/154,264).

Martini, Ranier et al.,"High duty cycle operation of quantum cascade lasers based on graded superlattice active regions," Journal of Applied Physics, Jun. 15, 2001, pp. 7735-7738,vol. 89, No. 12, XP012052642 ISSN:0021-8979, © 2001 American Institute of Physics (provided in related U.S. Appl. No. 12/354,237).

Sitori, Carlo et al.,"Mid-Infrared (8.5 μm) Semiconductor Lasers Operating at Room Temperature," IEEE Photonics Technology Letters, Mar. 1997, pp. 297-299, vol. 9, No. 3, XP000684396, ISN:1041-1135, © 1997 IEE (provided in related U.S. Appl. No. 12/354,237).

W.Y. Oh et al, "115 kHz tuning repetition rate ultrahigh-speed wavelength-swept semiconductor laser", received Apr. 11, 2005, accepted Aug. 9, 2005, pp. 3159-3163, vol. 30, No. 23, Optics Letters, © 2005 Optical Society of America.

Weida et al., "Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr . . . .

G.P. Luo et al.,Grating-tuned external-cavity quantum-cascade semiconductor lasers, May 7, 2001, Applied Physics Letters, vol. 78, No. 19, © 2001 American Institute of Physics (provided in related U.S. Appl. No. 12/354,237).

G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics (provided in related U.S. Appl. No. 12/354,237).

Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE (provided in related U.S. Appl. No. 12/354,237).

G. Totschig et al.,Mid-infrared external-cavity quantum-cascade laser XP-001161786, Oct. 15, 2002, pp. 1788-1790, Optics Letters/vol. 27, No. 20, © 2002 Optical Society of America (provided in related U.S. Appl. No. 12/354,237).

Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics (provided in related U.S. Appl. No. 12/354,237).

D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004 (provided in related U.S. Appl. No. 12/354,237).

Cassidy et al., Short-external-cavity module for ehanced single-mode tuning of InGaAsP and AlGaAs semiconductor diode lasers, Oct. 1991, No. 10, pp. 2385-2388, © 1991 American Institute of Physics.

M.G. Littman, H.J. Metcalf: "Spectrally narrow pulse dye laser without beam expander" Applied Optics, vol. 17, No. 14, Jul. 15, 1978, pp. 2224-2227, XP002528173 US.

Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.

Victor Rudometov and Eugene Rudometrov, Peltier Coolers, May 11, 2005, pp. 1-11, http://www.digit-life.com/article/peltiercoolers.com/ © Digit-Life.com 1997-2004 (provided in parent U.S. Appl. No. 11/154,264).

T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/ Applied Optics (provided in parent U.S. Appl. No. 11/154,264).

Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004 (provided in parent U.S. Appl. No. 11/154,264).

Transient FM Absorption Spectroscopy, Jun. 7, 2005, pp. 1 and 2, http://www.chem/tamu.edu/group/north/FM.html (provided in parent U.S. Appl. No. 11/154,264).

FM Spectoscopy With Tunable Diode Lasers, Application Note 7, pp. 1-10, New Focus Copyright 2001 (provided in parent U.S. Appl. No. 11/154,264).

John Andrews and Paul Dalin,Frequency Modulation Spectroscopy, Dec. 2005, pp. 24-26, http://www.spectroscopyeurope.com (provided in parent U.S. Appl. No. 11/154,264).

R.F. Curl and F.K. Tittel,Tunable infrared laser spectroscopy, 1998, pp. 219-272, Annu. Rep. Prog-Chem. Sect. C, 2002 (provided in parent U.S. Appl. No. 11/154,264).

Shawn Wehe et al., AIAA 2002-0824 Measurements of Trace Pollutants in Combustion Flows Using Room-Temperature, Mid-IR Quantum Cascade Lasers, S. Wehe, et al. (Physical Sciences, Inc.) C Gmachi and F Capasso (Bell Lab., Lucent Technologies), Jan. 2002, cover and pp. 1-7, 40th AIAA Aerospace Sciences Meeting and Exhibit 14, Jan. 17, 2002, Reno, NV (provided in parent U.S. Appl. No. 11/154,264).

W. Huang, RRA Syms, J. Stagg and A.A. Lohmann, Precision MEMS Flexure mount for a Littman tunable external cavity laser, Mar. 2004, pp. 67-75, IEE Prc-Sci Meas. Technol vol. 151, No. 2 Mar. 2004 (provided in parent U.S. Appl. No. 11/154,264).

K. Namjou, S. Cai, E.A. Whitaker, J. Faist, C. Gmacahi, F. Capasso, D.L. Sivco and A.Y. Cho,Sensitive absorption spectroscopy with a room-temperature distributed-feedback quantum-cascade laser, 1998, pp. 219-221, 1998 Optical Society of America (provided in parent U.S. Appl. No. 11/154,264).

Gregory E. Hall and Simon W. North,Transient Laser Frequency Modulation Spectroscopy, 2000, pp. 243-274, Annu. Rev.Phys. Chem. 2000.51:243-74-Copyright 2000 (provided in parent U.S. Appl. No. 11/154,264).

External-cavity quantum-cascade lasers, May 11, 2005, pp. 1-4, http://www.unine.ch/phys/meso/EC/EC.html (provided in parent U.S. Appl. No. 11/154,264).

Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India (provided in parent U.S. Appl. No. 11/154,264).

R.A. Syms, A. Lohmann, Moems Tuning Element for a Littrow External Cavity Laser, Dec. 2003, pp. 921-928, Journal of Microelectromechanical Systems, vol. 12, No. 6 Dec. 2003 (provided in parent U.S. Appl. No. 11/154,264).

A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America (provided in parent U.S. Appl. No. 11/154,264).

European Patent Office Communication pursuant to Article 94(3) EPC for European Application No. 06844137.7, dated Nov. 19, 2010, Daylight Solutions, Inc.(provided in related U.S. Appl. No. 12/354,237).

File:LED, 5mm, green (en).svg-Wikipedia, the free encyclopedia, Description English: A labeled drawing of a 5mm round (the "normal" type) LED. Apr. 6, 2009, 3 pages, http://en.wikipedia.org/wiki/File:LED,_5mm,_green(en).svg.

Cooke, M., Producing more light than heat from quantum cascade lasers, published on-line Jan. 10, 2010, www.semiconductor-today.com, Semiconductor Today, vol. 5, Issue 1, pp. 106-107, Feb. 2010.

Hildebrandt, L.et al.."Quantum cascade external cavity laser systems in the mid-infrared spectral range," 2004, Sacher Lasertechnik Group, Marburg, Germany (provided in parent U.S. Appl. No. 11/154,264).

Haim Lotem, Mode-hop suppression of Littrow grating-tuned lasers: comment, 20 Month 1994, p. 1, vol. 33, No. 00, Applied Optics.

Corrie David Farmer, "Fab and Eval. of QCL's", Sep. 2000, Faculty of Engineering, University of Glasgow, Glasgow, UK (provided in parent U.S. Appl. No. 11/154,264).

M. De Labachelerie and G. Passedat, Mode-hop suppression of Littrow grating-tuned lasers, Jan. 20, 1993, pp. 269-272, vol. 32, No. 3, Applied Optics, © 1993 Optical Society of America.

S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland (provided in parent U.S. Appl. No. 11/154,264).

Gaetano Scamarcio, Mid-IR and Thz Quantum Cascade Lasers, 2005, Physics Dept., University of Bari, Bari Italy (provided in parent U.S. Appl. No. 11/154,264).

Gaetano Scamarcio et al., Micro-probe characterization of QCLs correlation with optical performance, APL 78, 1177 & APL 78, 2095 (2001), APL 2002, APL 2004, University of Bari, Bari Italy (provided in parent U.S. Appl. No. 11/154,264).

J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation (provided in parent U.S. Appl. No. 11/154,264).

Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy (provided in parent U.S. Appl. No. 11/154,264).

J.M. Hensley et al., Demonstration of an External Cavity Terahertz Quantum Cascade Laser, Copyright 2005, Optical Society of America, Washington, DC 20036 (provided in parent U.S. Appl. No. 11/154,264).

L. Hildebrandt et al., Quantum cascade external cavity and DFB laser systems in the mid-infrared spectral range: devices and applications, 2004, Marburg Germany (provided in parent U.S. Appl. No. 11/154,264).

Richard Maulini et al., Broadly tunable external cavity quantum-cascade lasers, 2005, University of Neuchatel, Neuchatel Switzerland (provided in parent U.S. Appl. No. 11/154,264).

Tsekoun, A. et al; "Improved performance of QCL's through a scalable, manufacturable epitaxial-side-down mounting process"; Feb. 2006 (provided in parent U.S. Appl. No. 11/154,264).

Pushkarsky, M. et al.; "Sub-parts-per-billion level detection of NO2 using room temp. QCLs"; May 2006 (provided in parent U.S. Appl. No. 11/154,264).

Wirtz, D. et al.; "A tuneable heterodyne infrared spectrometer"; Physikalisches Institut; University of Koln; Koln Germany Spectrochimica 2002 (provided in parent U.S. Appl. No. 11/154,264).

Williams, B. et al.;"Terahertz QCLs and Electronics"; PhD-MIT 2003 (provided in parent U.S. Appl. No. 11/154,264).

M. Hacskaylo, "Laser Aiming Light," Army Electronics Command Fort Belvoir, Va Night Vision Lab, Jan. 1974, in 26 pages.

L. T. Marshall et al., "Integrated Sight," CECOM RDEC Night Vision and Electronic Sensors Directorate, Fort Belvoir, VA, Texas Instruments, Inc., Plano, TX, SPIE v. 3080, Jun. 1997, in 8 pages.

T. L. Myers et al., "FY 2005 Quantum Cascade Laser Alignment System Final Report," PNNL-15600, Dec. 2005, in 52 pages.

J. S. Randello et al., "The Integrated Sight: Future Improvements for Land Warrior," Proceedings of the SPIE—The International Society for Optical Engineerings, SPIE v. 3394, Aug. 1998, pp. 62-72.

Final Office Action mailed May 13, 2011 for U.S. Appl. No. 12/697,155 (related to present application), Day et al.

US 7,733,928, 06/2010, Marsland, Jr. et al. (withdrawn)

* cited by examiner

DETAIL B
SCALE 8 : 1

COMPACT MID-IR LASER

CROSS-REFERENCE TO RELATED APPLICATIONS

This application is a continuation of U.S. application Ser. No. 12/697,155 filed on Jan. 29, 2010 and entitled "Compact Mid-IR Laser" which is currently pending; and a continuation of U.S. application Ser. No. 12/354,237 filed on Jan. 15, 2009 now U.S. Pat. No. 7,873,094 and entitled "Compact Mid-IR Laser"; U.S. application Ser. Nos. 12/697,155 and 12/354,237 are continuations of U.S. application Ser. No. 11/154,264 filed on Jun. 15, 2005, entitled "Compact Mid-IR Laser" which issued on Feb. 17, 2009 under U.S. Pat. No. 7,492,806. As far as is permitted, the contents of U.S. application Ser. No. 12/697,155; U.S. application Ser. No. 12/354,237 and U.S. application Ser. No. 11/154,264 is incorporated herein by reference.

BACKGROUND OF THE INVENTION

1. Field of the Invention

Embodiments of the invention relate to a compact Mid-Infrared (MIR) laser which finds applications in many fields such as, molecular detection and imaging instruments for use in medical diagnostics, pollution monitoring, leak detection, analytical instruments, homeland security and industrial process control. Embodiments of the invention are also directed more specifically to the detection of molecules found in human breath, since such molecules correlate to existing health problems such as asthma, kidney disorders and renal failure.

2. Description of Related Art

MIR lasers of interest herein may be defined as, lasers having a laser output wavelength in the range of approximately 3-12 µm (3333-833 cm$^{-1}$). More broadly, however, "MIR" may be defined as wavelengths within a range of 3-30 µm. The far-IR is generally considered 30 300 µm, whereas the near IR is generally considered 0.8 to 3.0 µm. Such lasers are particularly advantageous for use in absorption spectroscopy applications since many gases of interest have their fundamental vibrational modes in the mid-infrared and thus present strong, unique absorption signatures within the MIR range.

Various proposed applications of MIR lasers have been demonstrated in laboratories on bench top apparatuses. Actual application of MIR lasers has been more limited and hampered by bulky size and cost of these devices.

One laser gain medium particularly useful for MIR lasers is the quantum cascade laser (QCL). Such lasers are commercially available and are advantageous in that they have a relatively high output intensity and may be fabricated to provide wavelength outputs throughout the MIR spectrum. QCL have been shown to operate between 3.44 and 84 µm and commercial QCL are available having wavelengths in the range of 5 to 11 µm. The QCL utilized two different semiconductor materials such as InGaAs and AlInAs (grown on an InP or GaSb substrate for example) to form a series of potential wells and barriers for electron transitions. The thickness of these wells/barriers determines the wavelength characteristic of the laser. Fabricating QCL devices of different thickness enables production of MIR laser having different output frequencies. Fine tuning of the QCL wavelength may be achieved by controlling the temperature of the active layer, such as by changing the DC bias current. Such temperature tuning is relatively narrow and may be used to vary the wavelength by approximately 0.27 nm/Kelvin which is typically less than 1% of the of peak emission wavelength.

The QCL, sometimes referred to as Type I Cascade Laser or Quantum Cascade Laser, may be defined as a unipolar semiconductor laser based on intersubband transitions in quantum wells. The QCL, invented in 1994, introduced the concept of "recycling" each electron to produce more than one photon per electron. This reduction in drive current and reduction in ohmic heating is accomplished by stacking up multiple "diode" regions in the growth direction. In the case of the QCL, the "diode" has been replaced by a conduction band quantum well. Electrons are injected into the upper quantum well state and collected from the lower state using a superlattice structure. The upper and lower states are both within the conduction band. Replacing the diode with a single-carrier quantum well system means that the generated photon energy is no longer tied to the material bandgap. This removes the requirement for exotic new materials for each wavelength, and also removes Auger recombination as a problem issue in the active region. The superlattice and quantum well can be designed to provide lasing at almost any photon energy that is sufficiently below the conduction band quantum well barrier.

Another type of Cascade Laser is the Interband Cascade Laser (ICL) invented in 1997. The ICL, sometimes referred to as a Type II QCL (Cascade Laser), uses a conduction-band to valence-band transition as in the traditional diode laser, but takes full advantage of the QCL "recycling" concept. Shorter wavelengths are achievable with the ICL than with QCL since the transition energy is not limited to the depth of a single-band quantum well. Thus, the conduction band to valance band transitions of the Type II QCLs provide higher energy transitions than the intra-conduction band transitions of the Type I QCLs. Typical wavelengths available with the Type II QCL are in the range of 3-4.5 µm, while the wavelengths for the Type I QCLs generally fall within the range of 5-20 µm. While Type II QCLs have demonstrated room temperature CW operation between 3.3 and 4.2. µm, they are still limited by Auger recombination. Clever bandgap engineering has substantially reduced the recombination rates by removing the combinations of initial and final states required for an Auger transition, but dramatic increases are still seen with active region temperature. It is expected that over time improvements will be made to the ICL in order to achieve the desired operating temperature range and level of reliability.

For purposes of the present invention, QCL and ICL may be referred to under the generic terminology of a "quantum cascade laser" or "quantum cascade laser device". The laser gain medium referred to herein thus refers to a quantum cascade laser. In the event that it is needed to distinguish between QCL and ICL, these capitalized acronyms will be utilized.

For the purposes of the present invention, the term "subband" refers to a plurality of quantum-confined states in nano-structures which are characterized by the same main quantum number. In a conventional quantum-well, the subband is formed by each sort of confined carriers by variation of the momentum for motion in an unconfined direction with no change of the quantum number describing the motion in the confined direction. Certainly, all states within the subband belong to one energy band of the solid: conduction band or valence band.

For the purposes of the present invention, the term "nanostructure" refers to semiconductor (solid-state) electronic structures including objects with characteristic size of the nanometer ($10^{-9}$) scale. This scale is convenient to deal with quantum wells, wires and dots containing many real atoms or atomic planes inside, but being still in the size range that should be treated in terms of the quantum mechanics.

For the purposes of the present invention term "unipolar device" refers to devices having layers of the same conductivity type, and, therefore, devices in which no p-n junctions are a necessary component.

The development of small MIR laser devices has been hampered by the need to cryogenically cool the MIR lasers (utilizing, for example, a large liquid nitrogen supply) and by the relatively large size of such devices hampering their portability and facility of use and thus limiting their applicability.

SUMMARY OF THE INVENTION

In accordance with embodiments of the invention, there is provided a MIR laser device having a monolithic design to permit the component parts thereof to be fixedly secured to a rigid optical platform so as to provide a highly portable rugged device. The MIR laser has a housing; a thermo electric cooling (TEC) device contained within the housing; a heat spreader contained within the housing and positioned either above a top surface of the TEC or above an intermediate plate which is positioned between the top surface of the TEC and the heat spreader. The MIR laser has a quantum cascade laser contained within the housing and fixedly coupled to the heat spreader; and an optical lens contained within the housing and fixedly mounted to the heat spreader for collimating light output from the quantum cascade laser and directing the collimated light to the exterior of the housing. The heat spreader serves to distribute heat to the TEC and also serves as an optical platform to fixedly position said quantum cascade laser and said optical lens relative to one another.

The TEC device provides cooling by means of the well known Peltier effect in which a change in temperature at the junction of two different metals is produced when an electric current flows through the junction. Of particular importance herein, there is no need for bulky and costly cryogenic equipment since liquid nitrogen is not utilized to effect cooling. The TEC device is used to cool the quantum cascade laser in a manner to permit it to stably operate for useful lifetimes in the application of interest without cryogenic cooling.

In one embodiment of the invention, the top surface of the TEC device serves as a substrate onto which is mounted the heat spreader. The heat spreader is effective to spread the heat by thermal conduction across the upper surface of the TEC device to efficiently distribute the heat from the quantum cascade laser to the TEC device for cooling. In preferred embodiments of the invention, the heat spreader has a high thermal conductivity such as a thermal conductivity within the range of approximately 150-400 W/mK and more preferably in the range of approximately 220-250 W/mK. The latter range includes high copper content copper-tungstens. An example of a suitable high conductivity material is copper tungsten (CuW), typically a CuW alloy. In accordance with other embodiments of the invention, a high thermal conductivity sub-mount is employed intermediate the quantum cascade laser and the heat spreader. The high thermal conductivity sub-mount may comprise industrial commercial grade diamond throughout its entirety or may be partially composed of such diamond. Diamond is a material of choice due to its extremely high thermal conductivity. In alternative embodiments, the high thermal conductivity sub-mount may be composed of a diamond top section in direct contact and a lower section of a different high thermal conductivity material, such as, for example CuW.

In other preferred embodiments, the heat spreader serves as an optical platform onto which the quantum cascade laser and the collimating lens are fixedly secured. The optical platform is as a rigid platform to maintain the relative positions of the lens and quantum cascade laser which are secured thereto (either directly or indirectly). The use of the heat spreading function and the optical platform function into a single material structure contributes to the small size and portability of the MIR laser device.

The quantum cascade laser is the laser gain medium of preference in accordance with embodiments of the invention and provides the desired mid-IR frequencies of interest. The quantum cascade laser may be one of the Type I or Type II lasers described above. Such a laser generates a relatively strong output IR beam but also generates quite a bit of heat, on the order of 10 W. Thus, the TEC device is an important component needed to remove the heat thereby permitting long lived operation of the quantum cascade laser. The optical lens is positioned such as to collimate the laser output of the quantum cascade laser to provide a collimated output beam directed outside of the housing. For this purpose, the quantum cascade laser is positioned a distance away from the optical lens equal to the focal length of the optical lens. In this manner, the source of light from the quantum cascade laser is collected and sent out as an approximately parallel beam of light to the outside of the housing.

Preferably, in accordance with embodiments of the invention, the overall size of the housing is quite small to permit facile portability of the MIR laser device, and for this purpose, the housing may have dimensions of approximately 20 cm×20 cm×20 cm or less, and more preferably has dimensions of approximately 3 cm×4 cm×6 cm. Further to achieve the desired small size and portability, the optical lens is selected to have a relatively small diameter. In preferred embodiments, the diameter of the lens is 10 mm or less, and in a most preferred embodiment, the diameter of the lens is approximately equal to 5 mm or less.

Other embodiments of the invention employ additionally an electronic subassembly incorporated into the housing. The electronic subassembly has a switch and a summing node, contained within said housing. The MIR laser device also has an input RF port for inputting an RF modulating signal into the electronic subassembly through an impedance matching circuit, and a drive current input terminal electrically connected to said quantum cascade laser for inputting drive current to said quantum cascade laser. There is further provided a switching control signal input terminal for inputting a switching control signal into the electrical subassembly of the housing for switching said switch between a first and second state. The first state of the switch passes the drive current to the quantum cascade laser permitting it to operate (on position of the quantum cascade laser) and the second state of the switch shunts the drive current to ground thus preventing the drive current from reaching the quantum cascade laser thereby ceasing operation of the quantum cascade laser (turn it off). Controlling the amount of on time to the amount of off time of the laser causes the laser to operate in pulse mode, oscillating between the on and off states at regular intervals according to a duty cycle defined by the time of the on/off states. This duty cycle control of a laser is well known to those skilled in the art and may be used to control the laser to operate in pulsed mode or, in the extreme case, maintaining the laser on all the time results in cw operation of the laser.

The summing node of the electronic subassembly is interposed in an electrical path between the drive current input terminal and the quantum cascade laser to add the RF modulating signal which is input at the RF input port to the laser drive current. RF modulation, also known as frequency modulation, is well known in absorption spectroscopy and is used to increase the sensitivity of a detecting system which detects the laser beam after it has passed through a sample gas of interest. The absorption dip due to absorption of the particular molecules of interest in the sample gas traversed by the laser beam is much easier to detect when the laser beam has been frequency modulated.

In accordance with other embodiments of the invention, there is provided a MIR laser device having a housing; a quantum cascade laser contained within the housing; and an optical lens contained within the housing and mounted for collimating light output from the quantum cascade laser. In order to achieve the small sizes needed for facile portability and ease of use, the optical lens is chosen to be quite small and has a diameter of approximately 10 mm or less. The optical lens is positioned a distance away from the quantum cascade laser equal to its focal length so that the optical lens serves to collimate the lens and direct a parallel laser beam toward the exterior of the housing. The housing is preferably hermetically sealed (to keep out moisture) and provided with an output window through which the collimated laser beam is passed to the exterior of the housing. In other preferred embodiments, the diameter of the lens is chosen to be 5 mm or less.

The electronic subassembly described above, with its RF modulation and switch for controlling the duty cycle of operation, may also be used in connection with the small lens diameter embodiment described immediately above.

In accordance with yet other embodiments of the invention, there is provided a MIR laser device having a housing; a quantum cascade laser contained within the housing; and an optical lens contained within the housing and mounted for collimating light output from the quantum cascade laser. In order to achieve the small sizes needed for facile portability and ease of use, the housing is chosen to be quite small and has a size of approximately 20 cm×20 cm×20 cm or less. The housing is preferably hermetically sealed (to keep out moisture) and provided with an output window through which the collimated laser beam is passed to the exterior of the housing. In other preferred embodiments, the size of the housing is approximately 3 cm×4 cm×6 cm.

The MIR laser device, in accordance with principles of embodiments of the invention, is very compact and light weight, and uses a quantum cascade laser as the laser gain medium. The quantum cascade laser may be selected for the particular application of interest within the frequency range of 3-12 μm by appropriate selection of the thickness of quantum wells and barriers. Such a compact, MIR laser enables a number of instruments to be developed in the fields of medical diagnostics, homeland security, and industrial processing, all based on laser absorption spectroscopy for molecular detection. Important characteristics of the MIR device is the use of a quantum laser as the laser gain media, short focal length aspheric lens, enhanced cooling techniques that do not require liquid nitrogen and the use of high integration and packaging. The resulting structure presents a foot print that is extremely small with a package size (housing size) of approximately 20 cm (height)×20 cm (width)×20 cm (length) or less. The length is taken along the optical axis. The packages size may be any integer or fraction thereof between approximately 1-20 cm for the length dimension combined with any integer or fraction thereof between approximately 1-20 cm in width dimension combined with any integer or fraction thereof between approximately 1-20 cm in the height dimension. A preferred footprint is approximately 3 cm (height)×4 cm (width)×6 cm (length) for the laser package.

Some advantages of the MIR device according to embodiments of the invention include high brightness with diffraction limited spatial properties and a narrow spectral width ($<100$ MHz=0.003 cm$^{-1}$). The quantum laser gain medium enables high output power (50 mW) and allows easy modulation at high frequency with very low chirp. The packaging technology is mechanically and environmentally robust with excellent thermal properties and provides for dramatic miniaturization.

In most conventional systems, cryogenic cooling has been required for MIR lasers. In contrast, the MIR laser device, in a preferred embodiment, can be temperature controlled close to room temperature without the need for bulky cryogenic cooling but rather employing thermo-electric coolers. Further, the MIR laser device in accordance with embodiments of the invention uses a packaging that specifically accommodates the designs associated with MIR photonics products with specific emphasis on thermal, optical and size requirements.

Further conventional drawbacks to a compact MIR laser device results from the high heat output of quantum cascade lasers—typically 10 W and even up to 15 W. This heat needs to be removed from the cavity efficiently to maintain cavity temperature and wavelength. This heat load typically requires a large heat sink to effectively remove the heat. In the MIR laser device according to embodiments of the invention, a high conductivity, heat-spreader is used and serves as a small but efficient transfer device to transfer the heat to a thermoelectric cooler.

An additional impediment to a compact MIR laser design is the conventional use of relatively large size lenses associated with MIR radiation. Typically, these lenses are >10-15 mm in diameter and often 25 mm or more. In contrast, the MIR laser device, in accordance with embodiments of the invention, uses a small aspheric lenses (approximately equal to or less than 5 mm D) that can be used in conjunction with the quantum cascade laser.

DETAILED DESCRIPTION OF THE PREFERRED EMBODIMENTS

Figure 1A:
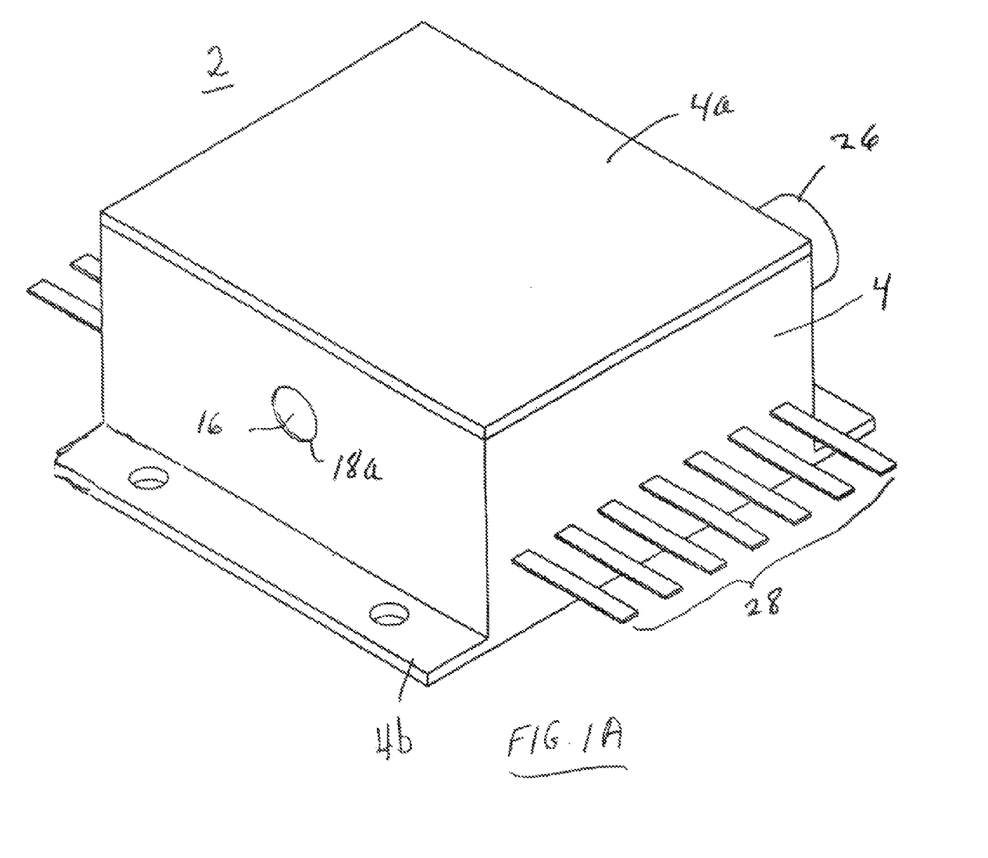
FIGS. 1A-1C show perspective views of the MIR laser device.
Figure 1B:
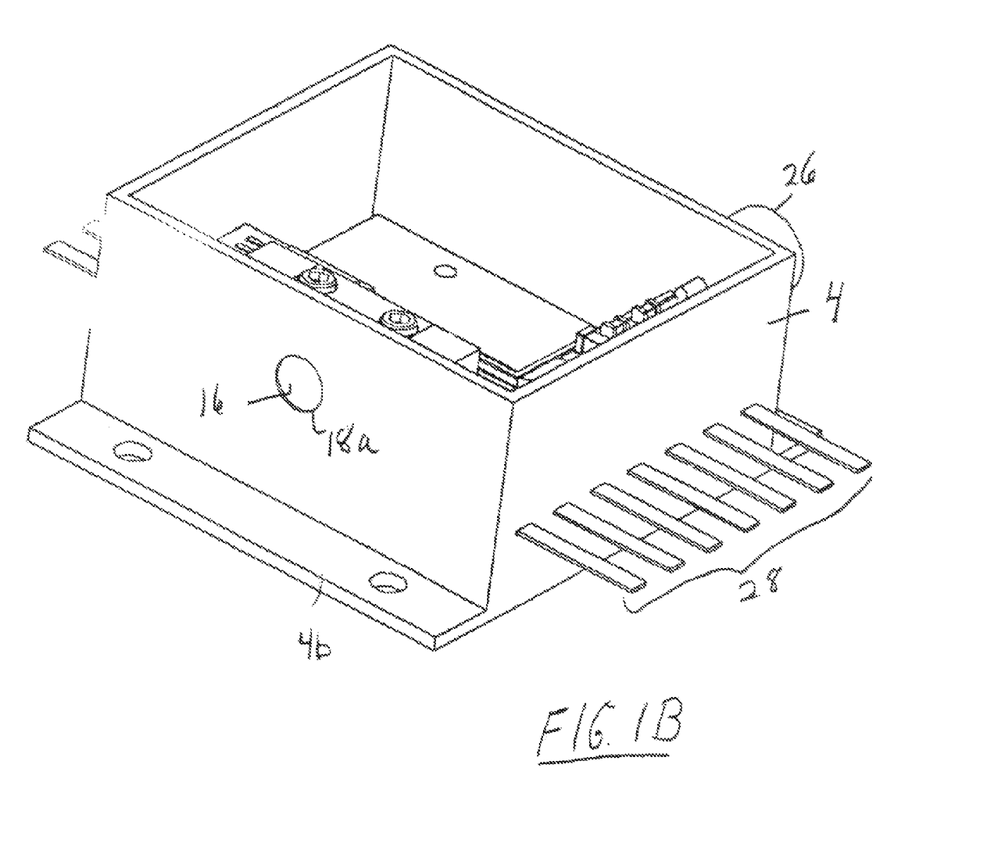
Figure 1C:
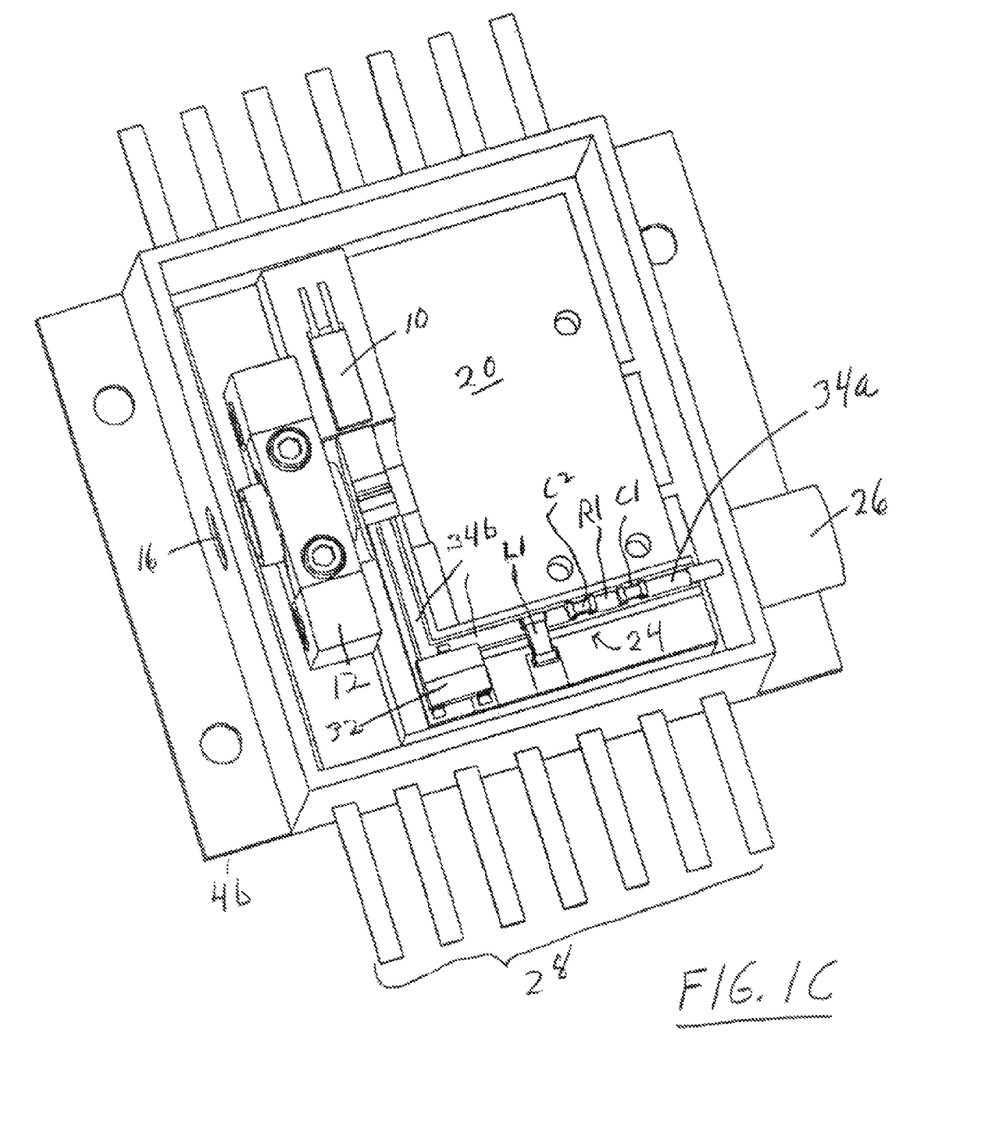
Figure 2A:
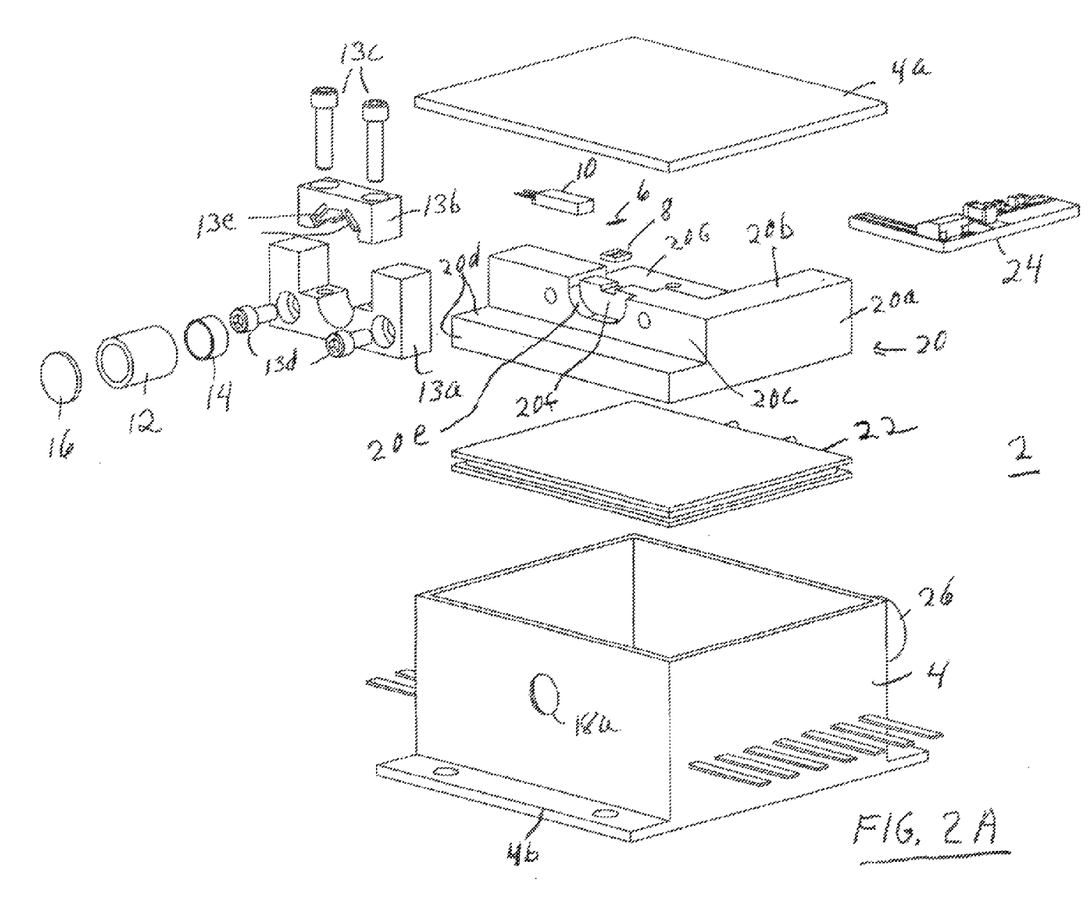
FIGS. 2A and 2B show exploded perspective view of the MIR laser device with FIG. 2B being rotated so show a back side of the laser device relative to FIG. 2A.
Figure 2B:
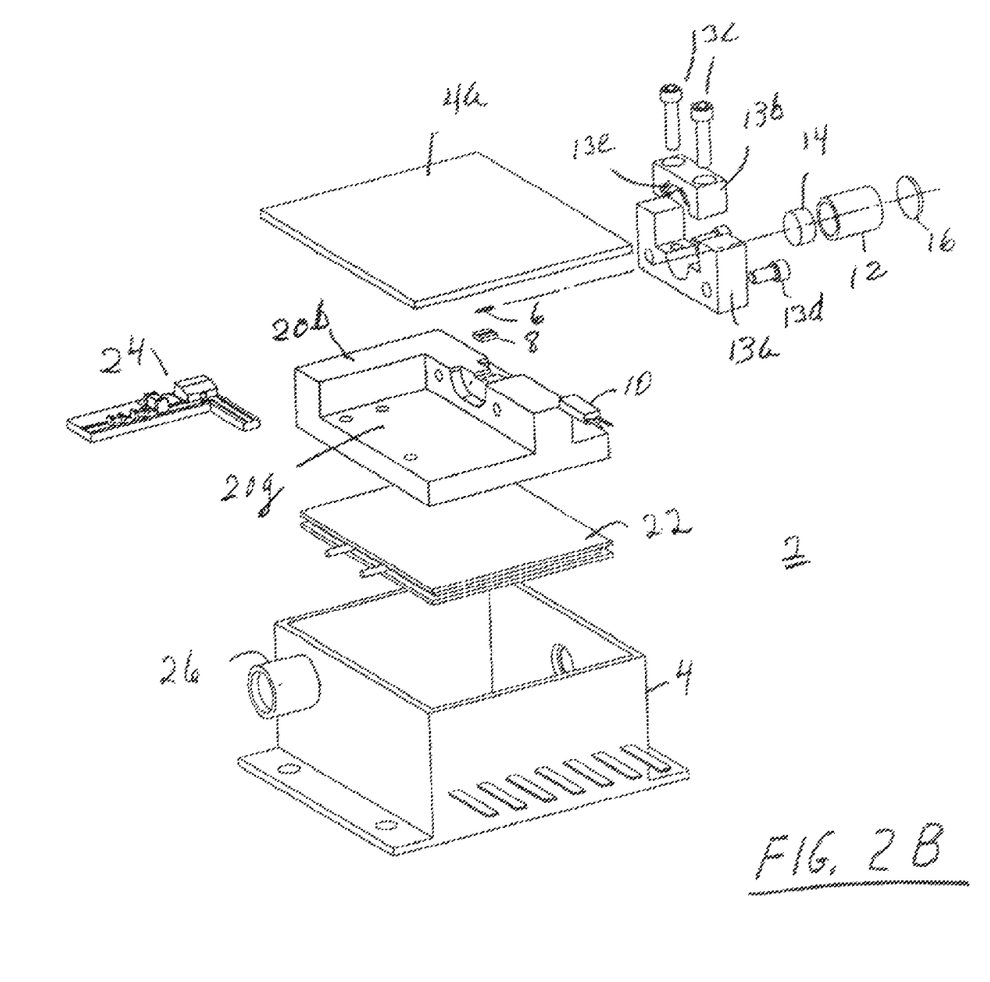
Figures 3, 4A, 4B:
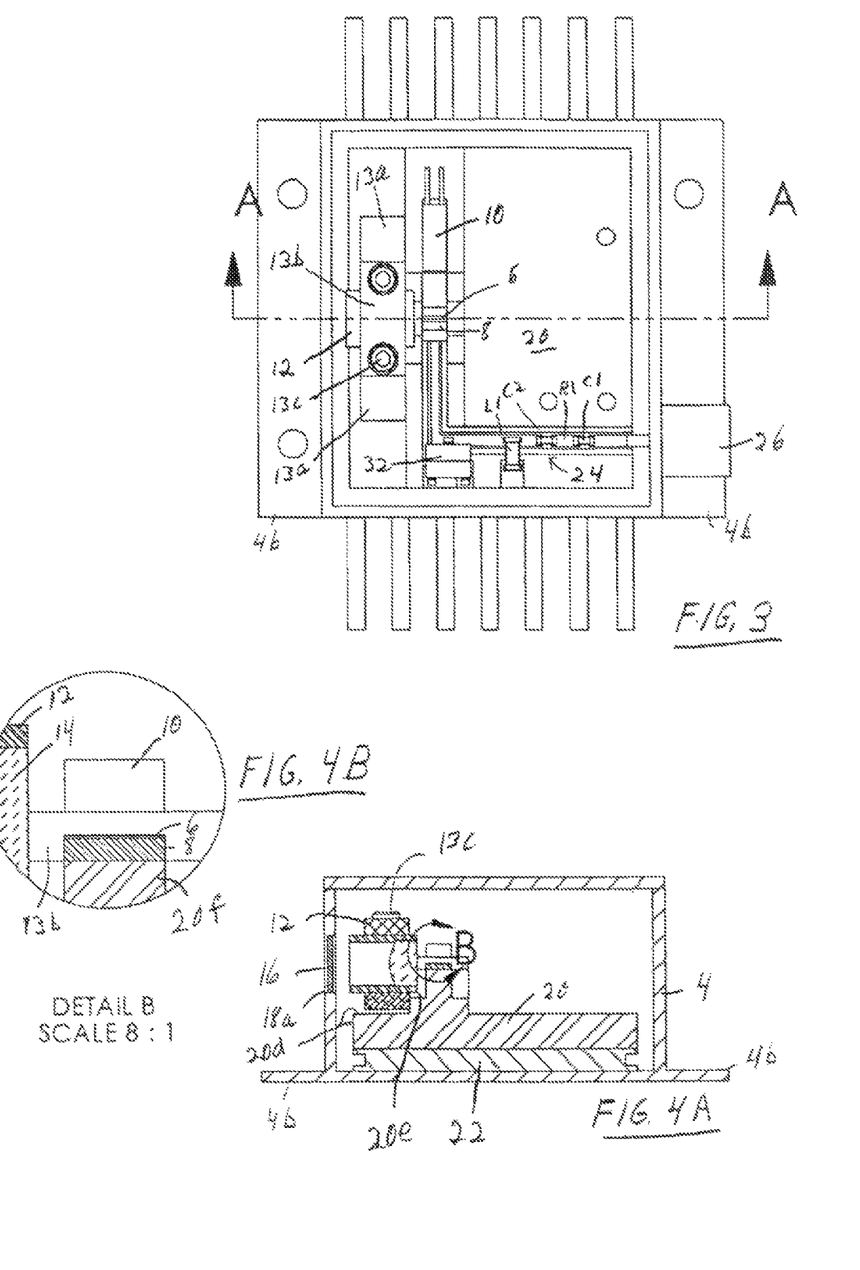
FIG. 3 shows a plan view of the MIR laser device with the top or lid removed to show the internal structure.
FIG. 4A shows a cross sectional view of the MIR laser device taken along lines A-A of FIG. 3.
FIG. 4B shows an enlarged view of a portion of FIG. 4A.

FIGS. 1A-1C show perspective views of a MIR laser device 2 in accordance with a first embodiment of the invention. FIG. 1A shows the MIR laser device 2 with the housing 4 including the lid or top cover plate 4a and mounting flanges 4b. FIGS. 1B and 1C show the MIR laser device 2 with the lid 4a removed, thus exposing the interior components. FIGS. 2A and 2B show exploded perspective, views of the various components of the MIR laser. FIGS. 3 and 4A show plan and side views respectively of the laser device and FIG. 4B shows an enlarged portion of FIG. 4A.

As may be seen from these figures, the MIR laser device is seen to include a laser gain medium 6 mounted on a high thermal conductivity sub-mount 8. There is further provided a temperature sensor 10, a lens holder 12, lens mount 13, output lens 14, and window 16. An output aperture 18a is provided in the side of the housing 4 with the window positioned therein. The MIR laser device is also comprised a heat spreader 20, cooler 22 and electronics sub-assembly 24. The heat spreader 20 also serves as the optics platform to which the key optical elements of the laser device are secured. Thus, more precisely, element 20 may be referred to as the heat spreader/optical platform and this composite term is sometimes used herein. However, for simplicity, element 20 may be referred to as a "heat spreader" when the heat transfer function is of interest and as an "optical platform" when the platform features are of interest. The housing 4 is also provided with an RF input port 26 and a plurality of I/O leads 28 which connect to the electronic sub-assembly 24 and temperature sensor 10.

The lens mount 13, especially as seen in FIGS. 2A and 2B, is seen to comprise a U-shaped support 13a, a retention cap 13b, top screws 13c and front screws 13d. The lens 14 is secured within the lens holder 12. The lens holder in turn is secured within the lens mount 13 and specifically between the lens U-shaped support 13a and the retention cap 13b. Spring fingers 13e secured to the retention cap 13b make pressure contact with the top portions of the lens holder 12 when the top screws 13c are tightened down to secure the retention cap 13b to the U-shaped support 13a using the top screws 13c. The front screws 13d secures the U-shaped support 13a to the optical platform 20. In this manner, the lens mount 13, (and consequently the lens 14 itself) is rigidly and fixedly secured to the optical platform 20.

The laser gain medium 6 is preferably a quantum cascade laser (either QCL or ICL) which has the advantages providing tunable MIR wavelengths with a small size and relatively high output intensity. Examples of such a laser include 3.7 µm and 9.0 µm laser manufactured by Maxion. These quantum cascade lasers have reflecting minors built into the end facets of the laser gain material. The laser gain medium 6 typically has a size of 2 mm×0.5 mm×90 microns and is mounted directly to the high thermal conductivity submount 8 utilizing an adhesive or weld or other suitable method of securing same. The high thermal conductivity sub-mount 8 is preferably made of industrial grade diamond and may have representative dimensions of 2 mm high×2 mm wide×0.5 mm long (length along the beam path). An alternative dimension may be 8 mm high.times.4 mm wide by 2 mm long. Other materials may also be used as long as they have a sufficiently high thermal conductivity sufficient to conduct heat from the laser gain medium 6 to the larger heat spreader 20. The thermal conductivity is preferably in the range of 500-2000 W/mK and preferably in the range of approximately 1500-2000 W/mK. In alternative embodiments, the high thermal conductivity submount 8 may be made of a layer of diamond mounted on top of a substrate of another high thermal conductive material such as CuW. For example, the overall dimensions of the submount may be 8 mm high×4 mm wide×2 mm long (length along the beam path), and it may be composed of a diamond portion of a size 0.5 mm high×2 mm wide×2 mm long with the remaining portion having a size of 7.5 mm high×2 mm wide×2 mm long and composed of CuW. In a most preferred embodiment of the invention, the size of the housing is 3 cm (height).×4 cm (width)×6 cm (length) where the length is taken along the optical axis and includes the two mounting flanges 4b on each end of the housing 4.

The heat spreader 20 may be fabricated from copper-tungsten or other material having a sufficiently high thermal conductivity to effective spread out the heat received from the high thermal conductivity sub-mount 8. Moreover heat spreader may be composed of a multilayer structure of high thermal conductivity. The high thermal conductivity sub-mount 8 may be secured to the heat spreader 20 by means of epoxy, solder, or laser welded.

The heat spreader 20 is placed in direct thermal contact with the cooler 22 which may take the form of a thermoelectric cooler (TEC) which provides cooling based on the Peltier effect. As best seen in FIG. 4, the cooler 22 is placed in direct thermal contact with the bottom wall of the housing 4 and transfers heat thereto. The bottom surface of the heat spreader 20 may be secured to the top surface of the cooler 22 by means of epoxy, welding, solder or other suitable means. Alternatively, an intermediate plate may be attached between the top surface of the cooler 22 and the bottom surface of the heat spreader 20 in order to provide further rigidity for the optical platform function of the heat spreader 20. This intermediate plate may serve as a substrate on which the heat spreader is mounted. If the intermediate plate is not utilized, then the top surface of the TEC heat cooler 22 serves as the substrate for mounting the heat spreader 20.

The laser device 2 may have its housing mounted to a heat sink (not shown) inside a larger housing (not shown) which may also contain additional equipment including cooling fans and vents to further remove the heat generated by the operation of the laser.

The cooler 22 is driven in response to the temperature sensor 10. The cooler may be driven to effect cooling or heating depending on the polarity of the drive current thereto. Currents up to 10-A may be required to achieve temperature stability in CW operation, with less required in pulsed operation. Temperature variations may be used to effect a relatively small wavelength tuning range on the order 1% or less.

The lens 14 may comprise an aspherical lens with a diameter approximately equal to or less than 10 mm and preferably approximately equal to or less than 5 mm. Thus, the focal length may be one of approximately 1, 2, 3, 4, 5, 6, 7, 8, 9, 10, 11, 12, 13, 14, 15, 16, 17, 18, 19, or 20 mm and any fractional values thereof. The focal length of the lens 14 is fabricated to be approximately ½ the size of the diameter. Thus, 10 mm diameter lens will have a focal length of approximately 5 mm, and a 5 mm diameter lens will have a focal length of approximately 2.5 mm. In practice, the lens focal length is slightly larger than ½ the diameter as discussed below in connection with the numeric aperture. The lens 14 serves as a collimating lens and is thus positioned a distance from the laser gain medium 6 equal to its focal length. The collimating lens serves to capture the divergent light from the laser gain medium and form a collimated beam to pass through the window 16 to outside the housing 4. The diameter of the lens is selected to achieve a desired small sized and to be able to capture the light from the laser gain medium which has a spot size of approximately 4 µm×8 µm.

The lens 14 may comprise materials selected from the group of Ge, ZnSe, ZnS Si, CaF, BaF or chalcogenide glass. However, other materials may also be utilized. The lens may be made using a diamond turning or molding technique. The lens is designed to have a relatively large numerical aperture (NA) of approximately of 0.6. Preferably the NA is 0.6 or larger. More preferably, the NA is approximately 0.7. Most preferably, the NA is approximately 0.8 or greater. To first order the NA may be approximated by the lens diameter divided by twice the focal length. Thus, selecting a lens diameter of 5 mm with a NA of 0.8 means that the focal length would be approximately 3.1 mm. The lens 14 has an aspheric design so as to achieve diffraction limited performance within the laser cavity. The diffraction limited performance and ray tracing within the cavity permits selection of lens final parameters dependent on the choice of lens material.

The small focal length of the lens is important in order to realize a small overall footprint of the laser device 2. Other factors contributing to the small footprint include the monolithic design of the various elements, particularly as related to the positioning of the optical components and the ability to efficiently remove the large amount of heat from the QCL serving as the laser gain medium 6.

The monolithic advantages of the described embodiments result from utilizing the heat spreader/optical platform 20 as an optical platform. The output lens 14 and laser gain medium 6 are held in a secured, fixed and rigid relationship to one another by virtue of being fixed to the optical platform 20. Moreover, the electronic subassembly is also fixed to the optical platform 20 so that all of the critical components within the housing are rigidly and fixedly held together in a stable manner so as to maintain their relative positions with respect to one another. Even the cooler 22 is fixed to the same optical platform 20. Since the cooler 22 takes the form of a thermoelectric cooler having a rigid top plate mounted to the underside of the optical platform 20, the optical platform 20 thereby gains further rigidity and stability. The thermoelectric cooler top plate is moreover of approximately the same size as the bottom surface of the heat spreader/optical platform 20 thus distributing the heat over the entire top surface of the cooler 22 and simultaneously maximizing the support for the optical platform 20.

The heat spreader/optical platform 20 is seen to comprise a side 20a, a top surface 20b, a front surface 20c, a step 20d, a recess 20e and bridge portion 20f and a heat distributing portion 20g. The electronic subassembly 24 is secured to the top surface 20b. The laser gain medium 6 may be directly secured to the bridge portion 20f. If an intermediate high thermal conductivity submount 8 is used between the laser gain medium 6 and the bridge portion 20f, the submount 8 is directly mounted to the bridge portion 20f and the laser gain medium 6 is secured to the submount 8. The lens mount is secured to the front surface of the optical platform 20 via the front screws 13d. As best seen in FIG. 4A, a portion of the lens holder 12 is received within the recess 20e. It may further be seen that the surface of the lens 14 proximate the laser gain medium 6 is also contained within the recess 20e. Such an arrangement permits the lens, with its extremely short focal length, to be positioned a distance away from the laser gain medium 6 equal to its focal length so that the lens 14 may serve as a collimating lens. The remaining portions of the lens 14 and the lens holder 12 not received within the recess 20e are positioned over the top surface of the step 20d. The heat distributing surface 20g of the heat spreader/optical platform 20 is seen to comprise a flat rigid plate that extends substantially over the entire upper surface of the thermo electric cooler 22. Other than the screw attachments, the elements such as the temperature sensor 10, laser gain medium 6, high thermal conductivity submount 8 and electronics subassembly 24 may be mounted to the heat spreader/optical platform 20 by means of solder, welding, epoxy, glue or other suitable means. The heat spreader/optical platform 20 is preferably made from a single, integral piece of high thermal conductivity material such as a CuW alloy.

The housing 4 is hermetically sealed and for this purpose the lid 4a may incorporate an "O" ring or other suitable sealing component and may be secured to the housing side walls in an air tight manner, e.g., weld or solder. Prior to sealing or closure, a nitrogen or an air/nitrogen mixture is placed in the housing to keep out moisture and humidity. The window 16 and RF input port 26 present air tight seals.

The temperature sensor 10 may comprise an encapsulated integrated circuit with a thermistor as the temperature sensor active component. A suitable such sensor is model AD 590 from Analog Devices. The temperature sensor 10 is positioned on the heat spreader 20 immediately adjacent the laser gain medium 6 and is effective to measure the temperature of the laser gain medium 6. As best seen in FIGS. 1C and 2A the temperature sensor 10 as well as the laser gain medium 6 are in direct thermal contact with the heat spreader 20. The temperature sensor 10 is in direct physical and thermal contact with the heat spreader 20. In one embodiment, the laser gain medium 6 is in direct physical and thermal contact with the high thermal conductivity submount 8. However, in other embodiments, the high thermal conductivity submount 8 may be eliminated and the laser gain medium 6 may be secured in direct physical and thermal contact with the heat spreader 20 with all other elements of the laser device remaining the same. The temperature sensor 10 is connected to the I/O leads 28. The temperature output is used to control the temperature of the cooler 22 so as to maintain the desired level of heat removal from the laser gain medium 6. It may also be used to regulate and control the injection current to the laser gain medium 6 which also provides a temperature adjustment mechanism. Varying the temperature of the laser gain medium 6 serves to tune the laser, e.g., vary the output wavelength.

The electronic sub-assembly 24 is used to control the laser gain medium 6 by controlling the electron injection current. This control is done by using a constant current source. In effect the quantum cascade laser behaves like a diode and exhibits a typical diode I-V response curve. For example, at and above the threshold current, the output voltage is clamped to about 9 volts.

Figure 5:
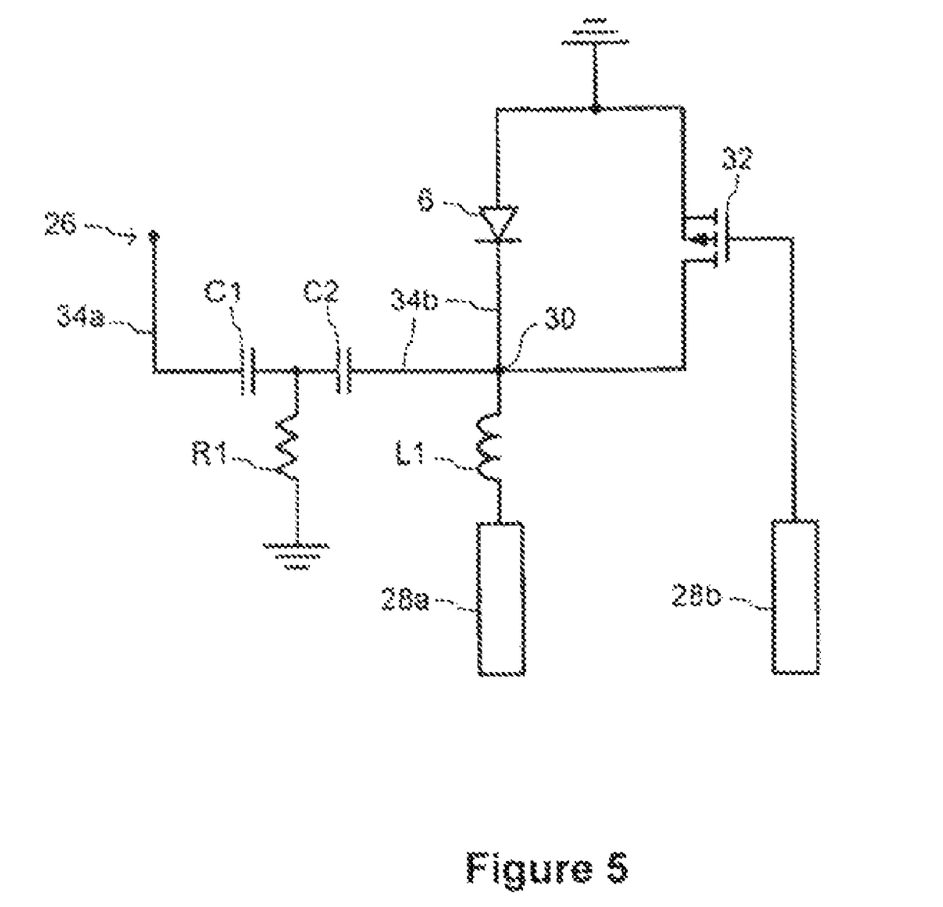
FIG. 5 shows a schematic diagram of the electronics subassembly of the first embodiment.

FIG. 5 shows a schematic diagram of the electronics subassembly 24. The electronics subassembly is seen to comprise capacitors C1 and C2, resistor R1, inductor L1, a summing node 30, switch 32, and leads 28a and 28b. A trace or transmission line 34a, 34b (see also FIG. 3) interconnects components. The polarities of the electronics subassembly 24 are selected for a chip arrangement in which the epitaxial layer of the quantum cascade laser is positioned downwardly. Polarities would be reversed if the epitaxial layer side is positioned upwardly.

The RF input port 26 is seen to be fed along the transmission line 34a to one side of the first capacitor C1. Resistor R1, which may comprise a thin film resistor, is positioned between capacitors C1 and C2 and connects the junction of these capacitors to ground. The capacitors and resistor implement an impedance matching circuit to match the low impedance of the quantum cascade laser with the 50 ohm input impedance line of the RF input cable. Transmission line 34b interconnects inductor L1 with the switch 32 and connects to the laser gain medium 6. The inductor L1 is fed by a constant current source (not shown) via one of the I/O leads, here identified as lead 28a. Inductor L1 serves to block the RF from conducting out of the housing through the current lead 28a. Similarly, a function of the capacitor C2 is to prevent the DC constant current form exiting the housing via the RF port 26. The switch 32 may take the form of a MOSFET and is biased by a switching control signal (TTL logic) fed to I/O lead 28b. Controlling the duty cycle of this switching control signal controls the relative on/off time of the MOSFET which is operative to pass the drive current either to the laser gain medium 6 (when the MOSFET is off) or to shunt the drive current to ground (when the MOSFET is on). With TTL logic in the illustrated circuit, a 0 volt switching control signal turns MOSFET off and thus the quantum cascade laser on, and a −5 volt switching control signal turns the MOSFET on and thus the quantum cascade laser off. By controlling the switching control signal duty cycle, pulse or cw operation may be realized.

An RF input signal is fed to the RF input port 26. This RF signal is used to frequency modulate the drive current signal to the laser gain medium 6 and is summed with the drive current at the summing node 30. Frequency modulation is commonly used to improve sensitivity in absorption spectroscopy. The center frequency is scanned across the expected resonance (using, for example, temperature tuning achieved by variation of the TEC cooler 22 or variation of the current fed to the quantum cascade laser). Frequency modulation places sidebands about the center frequency, and during the wavelength scanning a strong RF modulation may be observed when off resonance due to an imbalance in the absorption of the frequency sidebands. FM modulation thus effectively produces an AM modulation of the absorption signal. However, at resonance, the effect of the frequency sidebands is of opposite phase and equal magnitude so they cancel out. Sweeping the frequency about the resonance peak (dip) using FM modulation thus permits one to pinpoint more accurately the center of the absorption line which corresponds to a minimum in the AM modulation over the sweep range. Techniques for FM modulation are well known to those skilled in the art and reference is made to the following articles incorporated herein by reference: *Transient Laser Frequency Modulation Spectroscopy* by Hall and North, Annu Rev. Phys. Chem. 2000 51:243-74.

The quantum cascade lasers utilized herein have an intrinsically high speed. Thus, to effectively perform FM modulation, the modulated signal must be injected in close proximity to the quantum cascade laser to eliminate any excess inductance or capacitances associated with the laser connections to the RF signal. This is especially important in quantum cascade lasers which present a fairly low impedance and thus the reactance of the connections will critically limit the speed with which the device can be modulated. The circuit design as disclosed herein presents an extremely small footprint for connections of the RF input to the quantum cascade laser. Thus, for a 1 GHz modulation frequency, a representative range of transmission lengths from the RF input port 26 to the laser gain medium (QCL) (the sum of 34a and 34b) is 2-4 cm or less generally less than or equal to 4 cm. A preferred value is approximately 3 cm. If one desires to choose a broadband input for the FM modulation restricting the maximum frequency to 1 GHz, then the optimal transmission length is approximately 1 cm or greater. Such a transmission length would permit operating at 100 MHz for example or other values up to the 1 GHz level. Thus, in performing FM modulation of the quantum cascade laser a small transmission path is optimal in order to present a low inductance path to the QCL thereby permitting relatively high modulating frequency to be used. The small transmission paths may be suitably contained with the structures of the disclosed electronic subassembly 24.

It is noted that the entire electronic subassembly 24 is rigidly and fixedly mounted on the heat spreader 20 which serves, as indicated above as an optical platform. The fixing of the transmission lines and other electronic components to the optical platform achieves a rugged design which is largely insensitive to outside vibrational disturbances.

The input leads 28 are seen to comprise leads 28 and 28b and the RF input port 26 described above. Other I/O leads to the housing 4 include the +temp drive signal lead for the TEC to cause the TEC to be heated, a −temp drive signal lead to cause the TEC to be cooled, the temperature sensor input lead to provide a bias voltage to the thermistor temperature sensor, a temperature output lead to provided an output signal for the temperature sensor and a ground return path for the constant current input to the quantum cascade laser.

While the invention has been describe in reference to preferred embodiments it will be understood that variations and improvements may be realized by those of skill in the art and the invention is intended to cover all such modifications that fall within the scope of the appended claims.

What is claimed is:

1. A mid-IR (MIR) laser device comprising:
a quantum cascade laser that generates light output;
an optical lens that collimates the light output from the quantum cascade laser, wherein the optical lens has a numerical aperture that is greater than approximately 0.6, a diameter of less than approximately 5 millimeters, and a focal length of less than approximately 5 millimeters and wherein the optical lens is made of a material selected from the group consisting of Ge, ZnSe, ZnS Si, CaF, BaF, and chalcogenide glass;
a thermo electric cooling (TEC) device; and
a monolithic heat spreader secured to the TEC device, the heat spreader retaining the quantum cascade laser and the optical lens, the heat spreader having a thermal conductivity of at least approximately 220 W/mK, the heat spreader serving to distribute heat to the TEC device from the quantum cascade laser and also serving as an optical platform to fixedly position the quantum cascade laser and the optical lens relative to one another.

2. The MIR laser device of claim 1 wherein the heat spreader includes a bottom surface that is mounted to a top surface of the TEC device, and wherein the bottom surface of the heat spreader is approximately the same size as the top surface of the TEC device so that heat is distributed over the entire top surface of the TEC device.

3. The MIR laser device of claim 1 further comprising a housing that encloses the quantum cascade laser, the optical lens, the TEC device and the heat spreader; the housing having dimensions of less than approximately 20 centimeters by 20 centimeters by 20 centimeters.

4. The MIR laser device of claim 3 wherein the housing has dimensions of less than approximately 3 centimeters by 4 centimeters by 6 centimeters.

5. The MIR laser device of claim 1 further comprising a high thermal conductivity sub-mount positioned between the quantum cascade laser and the heat spreader, the sub-mount having a thermal conductivity of between approximately 500-2000 W/mK.

6. The MIR laser device of claim 1 further comprising an electronics sub-assembly comprising: a switch contained within the housing; an summing node, contained within the housing; an RF input port for inputting an RF modulating signal; a drive current input terminal electrically connected to the quantum cascade laser for inputting drive current to the quantum cascade laser; a switching control signal input terminal for inputting a switching control signal for switching the switch between a first and second state; the switch electrically connected to the quantum cascade laser and operative in a first state to turn the quantum cascade laser on and in a second state operative to turn the quantum cascade laser off; the summing node interposed in an electrical path between the drive current input terminal and the quantum cascade laser to add the RF modulating signal to the drive current.

7. The MIR laser device of claim 1 further comprising a switch electrically connected to the quantum cascade laser and operative to turn the quantum cascade laser on and to turn the quantum cascade laser off in a pulsing fashion.

8. The MIR laser device of claim 1 wherein the operation of the quantum cascade laser generates at least approximately ten watts of heat output, and wherein the TEC device can control the temperature of the quantum cascade laser to be approximately room temperature.

9. The MIR laser device of claim 1 wherein the quantum cascade laser includes end facets with reflecting mirrors built into the end facets.

10. A mid-IR (MIR) laser device comprising:
a quantum cascade laser that generates light output;
a switch electrically connected to the quantum cascade laser and operative to turn the quantum cascade laser on and to turn the quantum cascade laser off in a pulsing fashion;
an optical lens that collimates the light output from the quantum cascade laser, the optical lens having a numerical aperture that is greater than approximately 0.6, a diameter of less than approximately 5 millimeters, and a focal length of less than approximately 5 millimeters, and the optical lens being made of a material selected from the group consisting of Ge, ZnSe, ZnS Si, CaF, BaF, and chalcogenide glass;
a thermo electric cooling (TEC) device, the TEC device having a top surface;
a monolithic heat spreader secured to the TEC device, the heat spreader retaining the quantum cascade laser and the optical lens, the heat spreader having a thermal conductivity of at least approximately 220 W/mK, the heat spreader serving to distribute heat to the TEC device from the quantum cascade laser and also serving as an optical platform to fixedly position the quantum cascade laser and the optical lens relative to one another, the heat spreader including a bottom surface that is mounted to the top surface of the TEC device, and wherein the bottom surface of the heat spreader is approximately the same size as the top surface of the TEC device so that heat is distributed over the entire top surface of the TEC device;
a high thermal conductivity sub-mount positioned between the quantum cascade laser and the heat spreader, the sub-mount having a thermal conductivity of between approximately 500-2000 W/mK; and
a housing that encloses the quantum cascade laser, the optical lens, the TEC device, the switch, the sub-mount, and the heat spreader; the housing having dimensions of less than approximately 20 centimeters by 20 centimeters by 20 centimeters;
wherein the operation of the quantum cascade laser generates at least approximately ten watts of heat output, and wherein the TEC device can control the temperature of the quantum cascade laser to be approximately room temperature.

11. The MIR laser device of claim 10 wherein the quantum cascade laser includes end facets with reflecting mirrors built into the end facets.

12. A method for generating light output, the method comprising the steps of:
directing power to a quantum cascade laser to generate light output;
collimating the light output from the quantum cascade laser with an optical lens, the optical lens having a numerical aperture that is greater than approximately 0.6, a diameter of less than approximately 5 millimeters, and a focal length of less than approximately 5 millimeters, and the optical lens being made of a material selected from the group consisting of Ge, ZnSe, ZnS Si, CaF, BaF, and chalcogenide glass;
removing heat from the quantum cascade laser with a thermo electric cooling (TEC) device; and
retaining the quantum cascade laser and the optical lens with a monolithic heat spreader that also serves as an optical platform to fixedly position the quantum cascade laser and the optical lens relative to one another, the heat spreader being secured to the TEC device, the heat spreader having a thermal conductivity of at least approximately 220 W/mK.

13. The method of claim 12 wherein the step of retaining includes the heat spreader having a bottom surface that is mounted to a top surface of the TEC, and wherein the bottom surface of the heat spreader is approximately the same size as the top surface of the TEC device so that heat is distributed over the entire top surface of the TEC device.

14. The method of claim 12 further comprising the step of retaining the heat spreader, the laser, and the optical lens with a housing having dimensions of less than approximately 20 centimeters by 20 centimeters by 20 centimeters.

15. The method of claim 12 further comprising the step of positioning a high thermal conductivity sub-mount between the laser and the heat spreader, the sub-mount having a thermal conductivity of approximately 500-2000 W/mK.

16. The method of claim 12 further comprising the step of turning the quantum cascade laser on and off in a pulsing fashion.

* * * * *